(12) United States Patent
Matsuzawa et al.

(10) Patent No.: US 8,029,853 B2
(45) Date of Patent: Oct. 4, 2011

(54) FABRICATION PROCESS FOR MAGNETORESISTIVE DEVICES OF THE CPP TYPE

(75) Inventors: Hironobu Matsuzawa, Tokyo (JP); Tsutomu Chou, Tokyo (JP); Yoshihiro Tsuchiya, Tokyo (JP); Shinji Hara, Tokyo (JP)

(73) Assignee: TDK Corporation, Tokyo (JP)

( * ) Notice: Subject to any disclaimer, the term of this patent is extended or adjusted under 35 U.S.C. 154(b) by 506 days.

(21) Appl. No.: 12/292,566

(22) Filed: Nov. 20, 2008

(65) Prior Publication Data

US 2010/0124617 A1    May 20, 2010

(51) Int. Cl.
*B05D 5/12*  (2006.01)
(52) U.S. Cl. .................. 427/128; 204/192.25
(58) Field of Classification Search ........... 204/192.1, 204/192.25, 192.18; 427/128, 130
See application file for complete search history.

(56) References Cited

U.S. PATENT DOCUMENTS

2008/0278864 A1*  11/2008  Zhang et al. ............ 360/324.12

FOREIGN PATENT DOCUMENTS

| JP | A-2001-203408 | 7/2001 |
| JP | A-2004-244716 | 9/2004 |
| JP | A-2006-73579 | 3/2006 |
| JP | A-2008-91842 | 4/2008 |

* cited by examiner

*Primary Examiner* — Michael Cleveland
*Assistant Examiner* — Tabassom Tadayyon Eslami
(74) *Attorney, Agent, or Firm* — Posz Law Group, PLC

(57) ABSTRACT

The inventive fabrication process for magnetoresistive devices (CPP-GMR devices) involves the formation of a zinc oxide or ZnO layer that provides the intermediate layer of a spacer layer, comprising Zn film formation operation for forming a zinc or Zn layer and Zn film oxidization operation for oxidizing the zinc film after the Zn film formation operation. The Zn film formation operation is implemented such that after a multilayer substrate having a multilayer structure before the formation of the Zn film is cooled down to the temperature range of $-140°$ C. to $-60°$ C., the formation of the Zn film is set off, and the Zn film oxidization operation is implemented such that after the completion of the Zn film oxidization operation, oxidization treatment is set off at the substrate temperature range of $-120°$ C. to $-40°$ C. Thus, excelling in both flatness and crystallizability, the ZnO layer makes sure the device has high MR ratios, and can further have an area resistivity AR best suited for the device.

12 Claims, 6 Drawing Sheets

FABRICATION PROCESS FOR MAGNETORESISTIVE DEVICES OF THE CPP TYPE

BACKGROUND OF THE INVENTION

1. Field of the Invention

The present invention relates generally to a fabrication process for magnetoresistive devices of the CPP type (or CPP structure) adapted to read the magnetic field intensity of magnetic recording media or the like as signals, and more particularly to a process for the formation of a spacer layer that is a part of an essential device component and has influences on device's performance. The magnetoresistive device of CPP structure, for instance, may be used with hard disk drive systems, MRAMs, and magnetic sensors.

2. Explanation of the Prior Art

In recent years, with an increase in the longitudinal recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magnetoresistive device (hereinafter often called the MR device for short) and a recording head having a write-only induction type magnetic device are stacked together.

The MR device, for instance, includes an AMR device making use of the anisotropic magnetoresistive effect, a GMR device harnessing the giant magnetoresistive effect, and a TMR device tapping the tunnel-type magnetoresistive effect.

The reproducing head must have some characteristics in general, and high sensitivity and high output in particular. For the reproducing head capable of meeting such demands, there has already been a GMR head mass produced that makes use of a spin valve type of GRM device.

Such a spin valve type GMR device typically comprises, as part of the device, a spacer layer, a first magnetic layer (the so-called free layer) formed on one surface of the spacer layer, a second magnetic layer (fixed magnetization layer) formed on another surface of the spacer layer, and a pinning layer (generally an antiferromagnetic layer) formed in contact with the fixed magnetization layer that faces away from the spacer layer.

The free layer operates such that the direction of magnetization changes in response to a signal magnetic filed coming from outside, and the fixed magnetization layer has the direction of magnetization fixed by an exchange coupling magnetic field from the pinning layer (antiferromagnetic layer). With such device structure, MR changes are achievable via a difference in the relative angle of spins in two such ferromagnetic layers.

The structure of the spacer layer sandwiched between the first magnetic layer (the so-called free layer) and the second magnetic layer (the fixed magnetization layer) could be an imperative site that determines whether MR characteristics are good or bad. Applicant has already filed JP(A)2008-91842, proposing a specific multilayer structure best suited for the spacer layer. More specifically, Applicant discloses that the spacer layer is built up of a triple-layer structure comprising a first nonmagnetic metal layer and a second nonmagnetic metal layer, each one formed of a nonmagnetic metal material, and a ZnO semiconductor layer interposed between the first and the second nonmagnetic metal layer.

With the characteristics of the magnetoresistive device in mind, it would go without saying that of importance is what material is selected from the first and the second nonmagnetic metal layer. Yet, to allow the MR characteristics to work well, it has now turned out according to Inventors' intensive studies that another vital point is the method of forming the ZnO semiconductor layer that becomes the intermediate layer of the spacer layer, i.e., how to form that ZnO semiconductor layer. In particular, Zn has a melting point of as low as 420° C., and is more evaporable at lower temperatures in reduced pressure. For this reason, care must be taken of handling operation indigenous to Zn to which no attention has been paid so far.

Among prior arts that would appear to be relevant to the present invention, there is the one set forth in JP(A)2001-203408. The publication discloses a technique for forming an Al film while a substrate is being, or has been, cooled down. The publication states that the obtained Al film naturally oxidizes into an $Al_2O_3$ film; however, nowhere is any specific oxidization condition referred to. That $Al_2O_3$ film is quite different from ZnO, to which the fabrication process of the invention is to be applied, in terms of compound. Furthermore, the $Al_2O_3$ film disclosed in JP(A)2001-203408 should preferably be in an amorphous film structure form, whereas the ZnO film, to which the present invention is to be applied, should preferably have a film structure of good crystallizability: there is a sheer difference in the film characteristics demanded for both.

The situations being like this, the present invention has been made for the purpose of, with how to form the ZnO film in the spacer layer in mind, providing a fabrication process for magnetoresistive devices, which can not only achieve high MR ratios but have an area resistivity (AR) best suited for device fabrication as well. In terms of ideal morphology, the ZnO film should excel in both flatness and crystallizability.

SUMMARY OF THE INVENTION

According to the present invention, the aforesaid object is accomplished by the provision of a fabrication process for a giant magnetoresistive device (CPP-GMR device) of CPP (current perpendicular to plane) structure, comprising a spacer layer comprising a first nonmagnetic metal layer and a second nonmagnetic layer, each one formed of a nonmagnetic metal material, with a zinc oxide or ZnO layer interposed between said first and second nonmagnetic metal layers, and a first ferromagnetic layer and a second ferromagnetic layer stacked and formed with said spacer layer sandwiched between them, with a sense current applied in the stacking direction, wherein said fabrication process comprises a first nonmagnetic metal layer formation step for forming said first ferromagnetic layer, a step of forming said first nonmagnetic metal layer on said first ferromagnetic layer, a step of forming said zinc oxide or ZnO layer on said first nonmagnetic metal layer, a step of forming said second nonmagnetic metal layer on said zinc oxide layer, and a step of forming said second ferromagnetic layer on said second nonmagnetic metal layer, wherein the step of forming said zinc oxide layer comprises Zn film formation operation for forming a zinc or Zn film and Zn film oxidization operation for oxidizing said zinc film after the Zn film formation operation, wherein:

said Zn film formation operation is implemented such that after a multilayer substrate having a multilayer structure before the formation of the Zn film is cooled down to a temperature range of −140° C. to −60° C., the formation of the Zn film is set off, and said Zn film oxidization operation is implemented such that after the completion of said Zn film oxidization operation, oxidization treatment is set off at a substrate temperature range of −120° C. to −40° C.

In a preferable embodiment of the invention, the oxidization treatment in the Zn film oxidization operation is a radical oxidization method.

In a preferable embodiment of the invention, said zinc oxide or ZnO layer has a thickness of 1.0 to 2.5 nm.

In a preferable embodiment of the invention, one-set operation comprising said Zn film formation operation and said Zn film oxidization operation is implemented at least twice.

In a preferable embodiment of the invention, Zn is formed at a thickness of 0.3 to 2.0 nm in said one-set operation.

In a preferable embodiment of the invention, one-set operation comprising said Zn film formation operation and said Zn film oxidization operation is implemented at least thrice.

In a preferable embodiment of the invention, Zn is formed at a thickness of 0.3 to 1.5 nm in said one-set operation.

In a preferable embodiment of the invention, said first and second ferromagnetic layers are set up such that the angle made between their mutual directions of magnetization changes relatively in response to an external magnetic field.

In a preferable embodiment of the invention, said first nonmagnetic metal layer is copper or Cu, and said second nonmagnetic metal layer is zinc or Zn.

The invention also provides a fabrication process for a thin-film magnetic head comprising a magnetoresistive device, wherein the magnetoresistive device is fabricated by the aforesaid fabrication process for a magnetoresistive device.

Further, the invention provides a fabrication process for a head gimbal assembly comprising a slider including a thin-film magnetic head and located in such a way as to oppose to a recording medium, and a suspension adapted to resiliently support said slider, wherein said thin-film magnetic head is fabricated by the aforesaid fabrication process for a thin-film magnetic head.

Yet Further, the invention provides a fabrication process for a magnetic disk system comprising a slider including a thin-film magnetic head and located in such a way as to oppose to a recording medium, and a positioning device adapted to support and position said slider with respect to said recording medium, wherein said thin-film magnetic head is fabricated by the aforesaid fabrication process for a thin-film magnetic head.

EXPLANATION OF THE PREFERRED EMBODIMENTS

The best mode for carrying out the invention is now explained in greater details.

To let those skilled in the art have an easy understanding of the fabrication process for magnetoresistive devices according to the invention, the magnetoresistive device to be fabricated and the structure of a thin-film magnetic head comprising that device are now explained prior to the explanation of the fabrication process.

Figure 1:
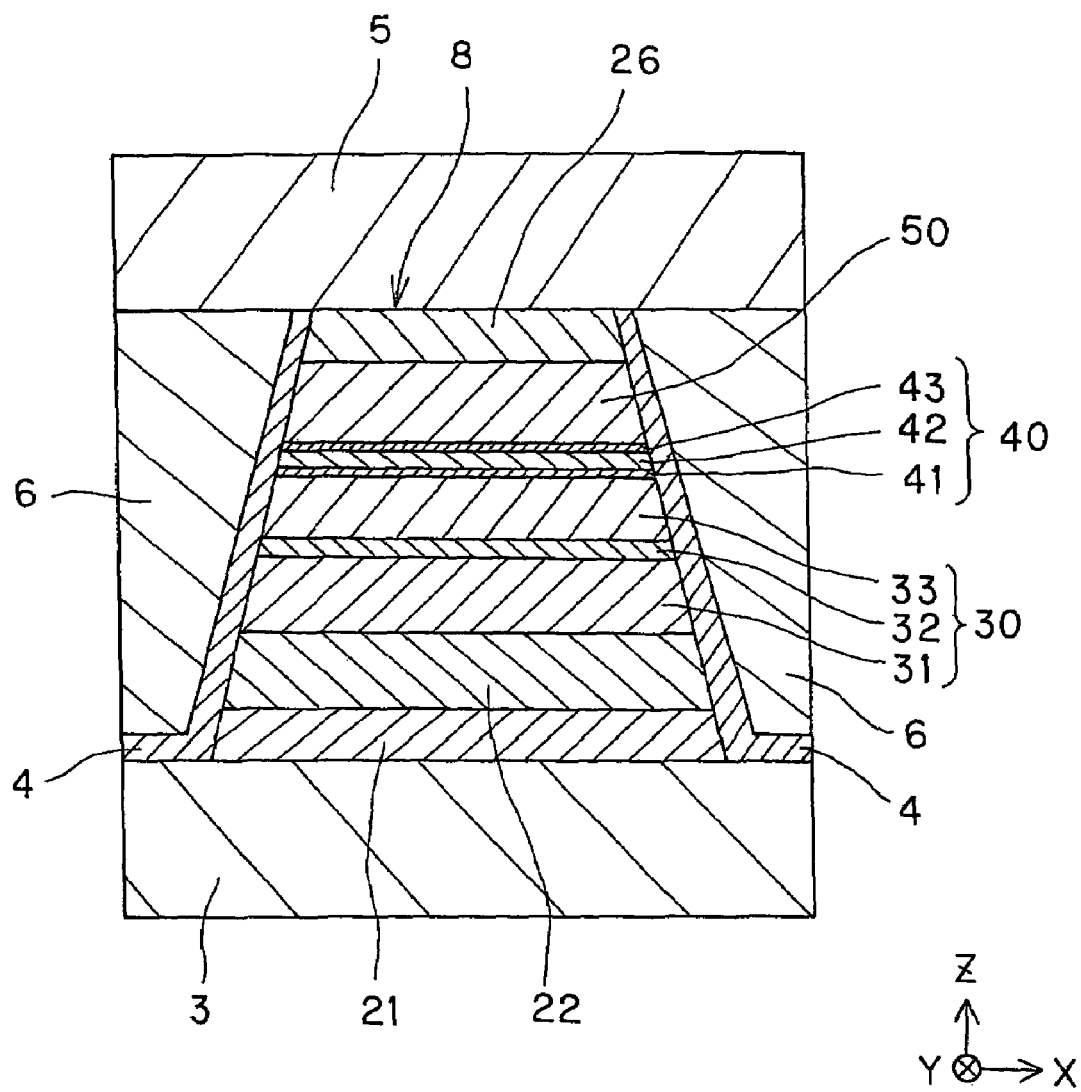
FIG. 1 is a sectional view of one embodiment of the invention, especially its section parallel with the surface of the reproducing head opposite to a medium.

FIG. 1 is illustrative of the ABS (air bearing surface) of a reproducing head in one embodiment of the invention: it is illustrative in schematic of the ABS of the giant magnetoresistive device (CPP-GMR device) of the CPP structure in particular. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

FIGS. 2A to 2D are illustrative over time of how to fabricate the magnetoresistive device of a reproducing head in particular, and FIGS. 3A to 3D are plan views of how to fabricate components near the magnetoresistive device of the reproducing head.

Figure 4:
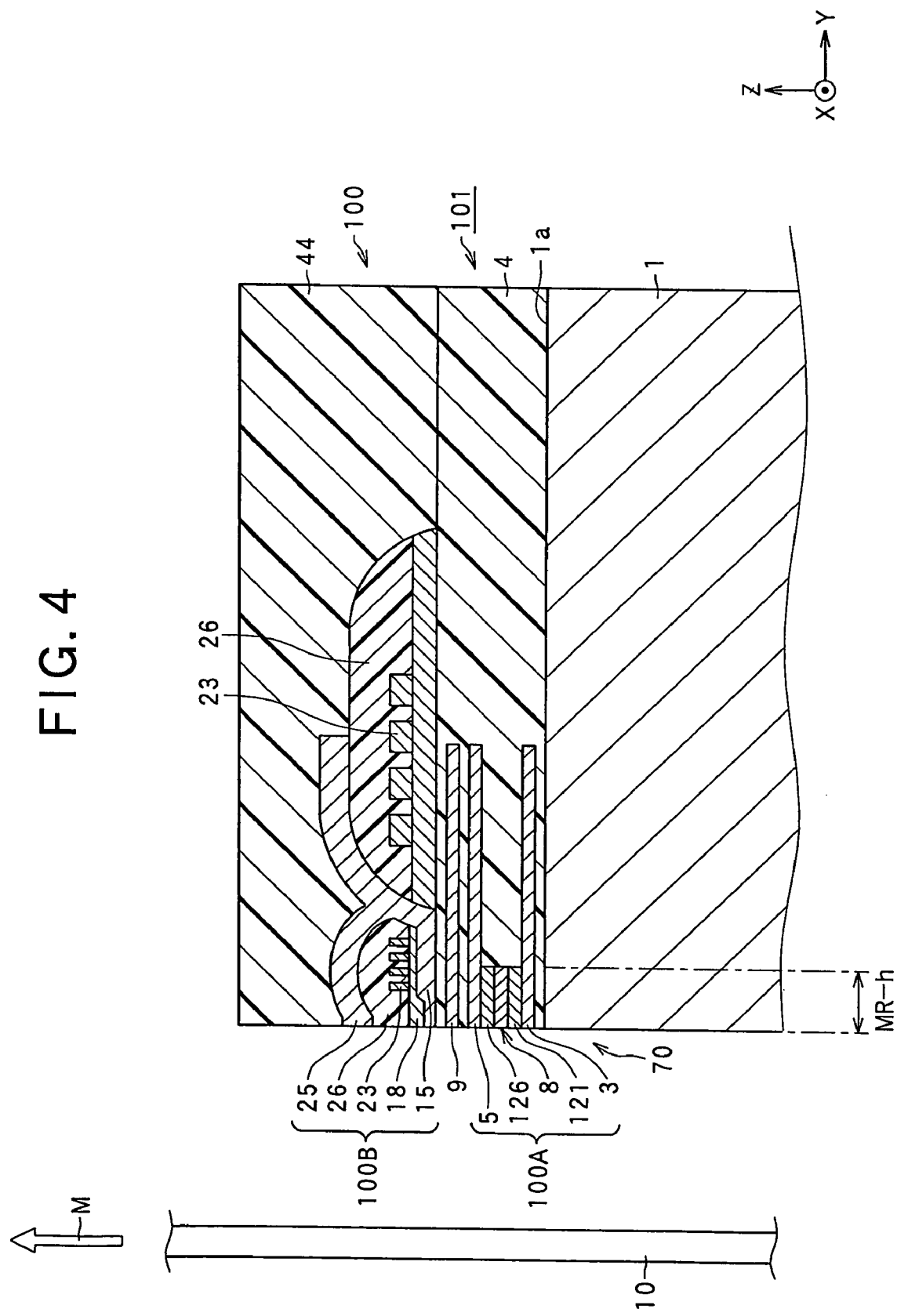
FIG. 4 is illustrative of the construction of the thin-film magnetic head according to one preferable embodiment of the invention: it is a sectional view of the surfaces of the thin-film magnetic head opposite to a medium and vertical to a substrate.

FIG. 4 is illustrative of the construction of the thin-film magnetic head according to one preferable embodiment of the invention: it is a sectional view of the ABS of the thin-film magnetic head and its surface vertical to the substrate.

Figure 5:
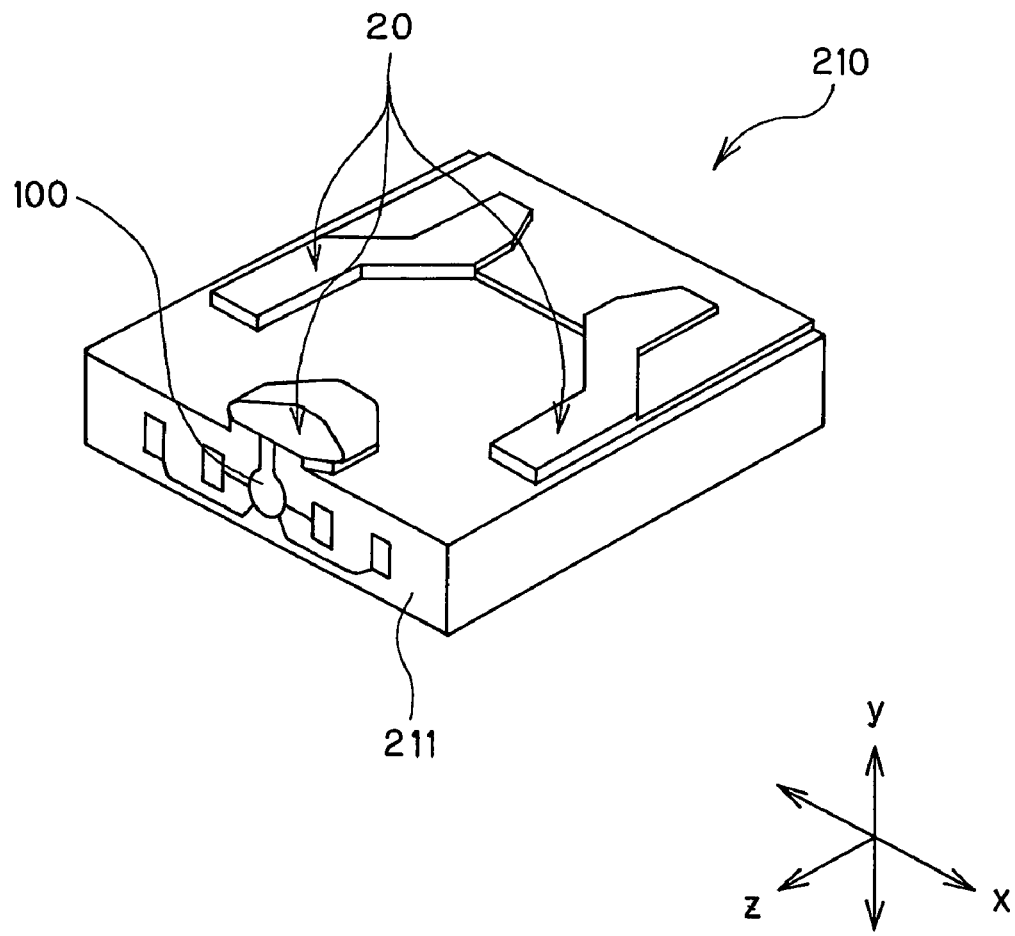
FIG. 5 is illustrative in perspective of the slider included in the head gimbal assembly according to one embodiment of the invention.
Figure 6:
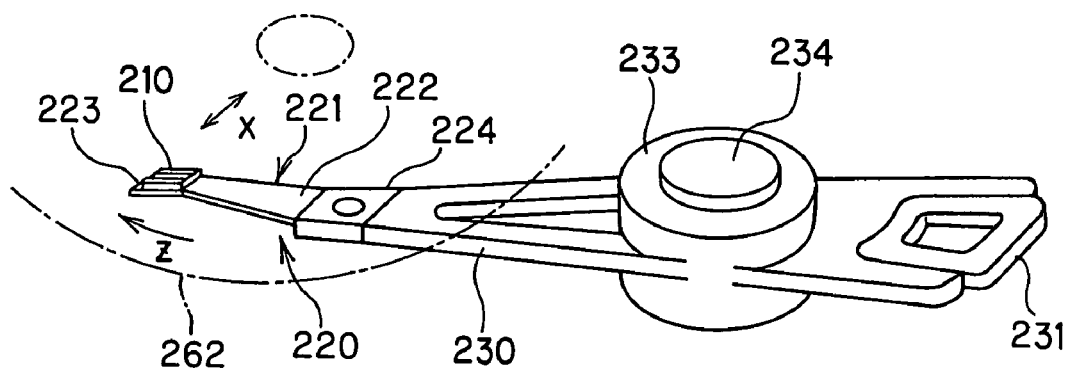
FIG. 6 is illustrative in perspective of the head arm assembly comprising the head gimbal assembly according to one embodiment of the invention.
Figure 7:
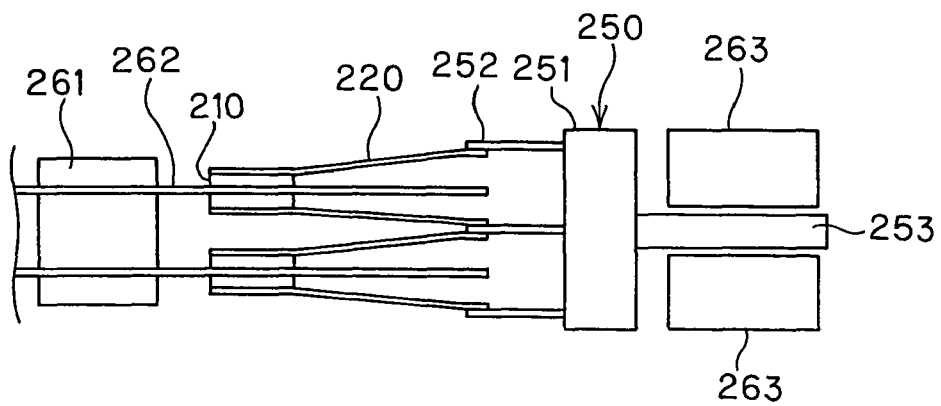
FIG. 7 is illustrative of part of the magnetic disk system according to one embodiment of the invention.
Figure 8:
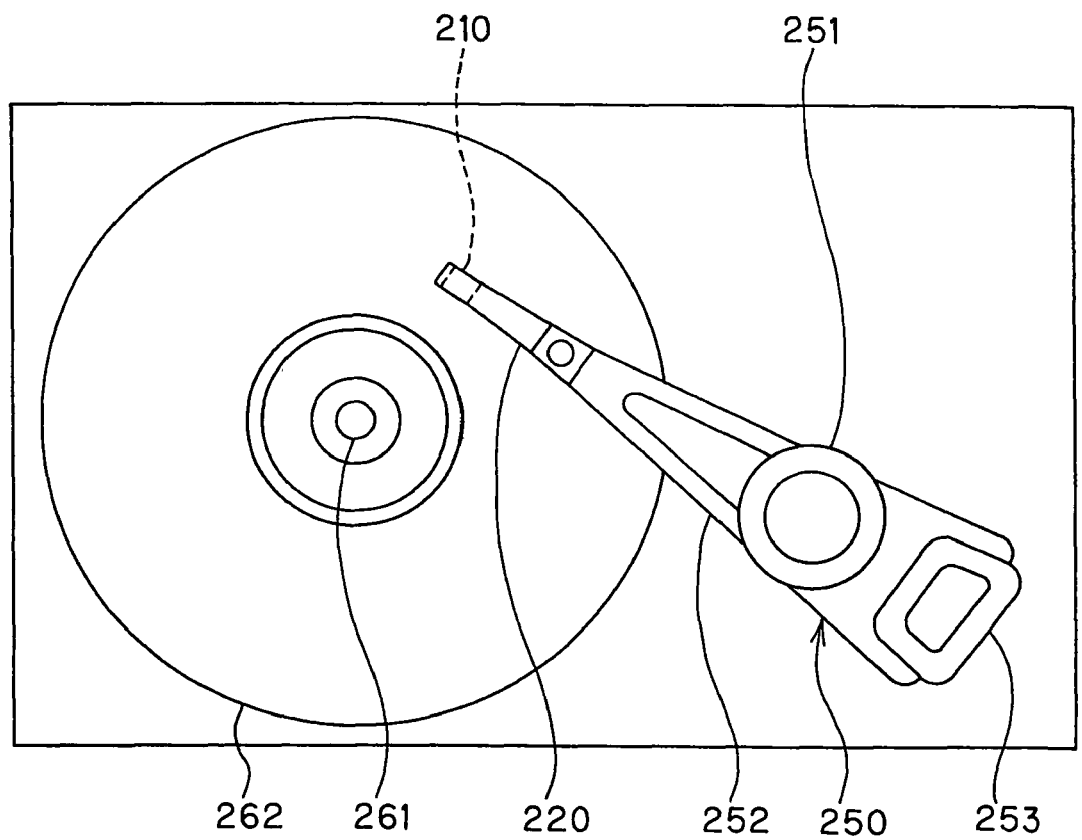
FIG. 8 is a plan view of the magnetic disk system according to one embodiment of the invention.

FIG. 5 is illustrative in perspective of the slider included in the head gimbal assembly according to one embodiment of the invention. FIG. 6 is illustrative in perspective of the head arm assembly comprising the head gimbal assembly according to one embodiment of the invention. FIG. 7 is illustrative of part of the magnetic disk system according to one embodiment of the invention. FIG. 8 is a plan view of the magnetic disk system according to one embodiment of the invention.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Giant Magnetoresistive Device (CPP-GMR Device) of the CPP Structure]

The construction of the reproducing head comprising the inventive giant magnetoresistive device (CPP-GMR device) of the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 5 that are located at a given space and opposed vertically on the sheet, a giant magnetoresistive device 8 (hereinafter referred simply to as the "GMR device 8" or "magnetoresistive device 8") interposed between the first shield layer 3 and the second shield layer 5, an insulating film 4 adapted to cover two sides of the GMR device 8 and a part of the upper surface of the first shield layer 3 along those sides, and two bias magnetic field-applying layers 6 adjacent to two such sides of the GMR device 8 via the insulating layer 4.

In the embodiment here, the first 3 and the second shield layer 5 take a so-called magnetic shield role plus a pair-of-electrodes role. In other words, they have not only a function of shielding magnetism but also function as a pair of electrodes adapted to pass a sense current through the GMR device 8 in a direction intersecting the plane of each of the layers forming the GMR device 8, for instance, in a direction perpendicular to the plane of each of the layers forming the GMR device 8 (stacking direction).

Apart from the first 3 and the second shield layer 5, another pair of electrodes may additionally be provided above and below the GMR device.

The reproducing head shown in FIG. 1 comprises the GMR device 8 of the CPP structure. Referring to the inventive GMR device 8 of the CPP structure in terms of a broad, easy-to-understand concept, it comprises a spacer layer 40, and two ferromagnetic layers 30 and 50 stacked and formed with the spacer layer 40 sandwiched between them, as depicted in FIG. 1. For the sake of convenience, the ferromagnetic layer 30 positioned below may be referred to as the first ferromagnetic layer 30, and the ferromagnetic layer 50 positioned above may be called the second ferromagnetic layer 50.

The ferromagnetic layer 30, 50 may have a nonmagnetic metal layer (nonmagnetic intermediate layer) inside. For instance, there is the mention of a synthetic pinned layer.

In the embodiment shown in FIG. 1, the ferromagnetic layer 30 positioned below becomes a fixed magnetization layer 30, and the ferromagnetic layer 50 positioned above becomes a free layer 50. And as a sense current is applied in the stacking direction of the GMR device 8, it causes the device to perform its own function: there is the GMR device 8 of the CPP (current perpendicular to plane) structure involved.

The free layer 50 has the direction of magnetization changing in response to an external magnetic field, i.e., a signal magnetic field from the recording medium, and the fixed magnetization layer 30 has the direction of magnetization fixed under the action of an anti-ferromagnetic layer 22. In FIG. 1, there is one embodiment shown in which the antiferromagnetic layer 22 is formed on the bottom side (the side of the first shield layer 3); in one possible modification to it, however, the antiferromagnetic layer 22 may be formed on the top side (the side of the second shield layer 5) so that the free layer 50 and the fixed magnetization layer 30 are interchanged in position.

(Explanation of the Fixed Magnetization Layer 30)

In one embodiment of the invention, the first ferromagnetic layer functions as the fixed magnetization layer 30, and that fixed magnetization layer 30 is formed on the antiferromagnetic layer 22 having a pinning action via an underlay layer 21 formed on the first shield layer 3.

In a preferable embodiment of the invention, the fixed magnetization layer 30 has a so-called synthetic pinned layer arrangement comprising, in order from the side of the antiferromagnetic layer 22, an outer layer 31, a nonmagnetic intermediate layer 32 and an inner layer 33, all stacked together in order.

The outer layer 31, and the inner layer 33 is provided by a ferromagnetic layer made of, for instance, a ferromagnetic material containing Co, and Fe. The outer 31 and the inner layer 33 are antiferromagnetically coupled and fixed such that their magnetization directions are opposite to each other.

The outer 31, and the inner layer 33 is preferably made of, for instance, a $CO_{70}Fe_{30}$ (atomic %) alloy. The outer layer has a thickness of preferably about 2 to 7 nm, and the inner layer 33 has a thickness of preferably about 2 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of, for instance, about 0.3 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of about 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may additionally include a nonmagnetic metal layer (nonmagnetic intermediate layer) inside. The free layer 50 may contain a Heusler alloy layer as well.

On such free layer 50, there is a protective layer 26 formed, which comprises a Ta or Ru layer as an example, as shown in FIG. 1. The protective layer 26 has a thickness of about 0.5 to 20 nm.

(Explanation of the Spacer Layer 40)

In the invention, the spacer layer 40 is made up of a first nonmagnetic metal layer 41 and a second nonmagnetic metal layer 43, and a zinc oxide or ZnO layer 42 interposed between these first and second nonmagnetic metal layers 41 and 43, as shown in FIG. 1.

More specifically, the spacer layer 40 is made up of a triple-layer structure comprising first nonmagnetic metal layer 41/zinc oxide or ZnO layer 42/the second nonmagnetic metal layer 43 stacked together in order. In the embodiment here, the first nonmagnetic metal layer 41 is positioned on the side of the fixed magnetization layer 30, while the second nonmagnetic metal layer 43 is positioned on the side of the free layer 50, as depicted in FIG. 1.

In such a triple-layer structure, it is preferable that the first nonmagnetic metal layer 41 is made up of Cu, and the nonmagnetic metal layer 43 is made up of Zn. In other words, the construction of Cu/ZnO/Cu is particularly preferable.

These layers are each explained in more details.

Zinc Oxide Layer 42

The zinc oxide layer 42 that constitutes a part of the spacer layer 40 is made of zinc oxide or ZnO.

Essential part of the inventive device fabrication process lies especially in how to form the zinc oxide or ZnO film, as described later in greater details.

Such zinc oxide layer 42 should have a thickness in the range of 1.0 to 2.5 nm, preferably 1.4 to 2.2 nm, and more preferably 1.6 to 2.0 nm. As this value falls short of 1.0 nm, there are large variations of device characteristics such as area resistivity AR likely to occur. As the thickness is in excess of 2.5 nm, on the other hand, there is inconvenience that there is a deviation from the resistance area demanded for the CPP-GMR device.

Such a thin film is usually heat treated at 200 to 350° C. for 1 to 10 hours after film-formation for the purpose of crystallizing the ZnO layer thereby making its resistance low. By the "after film-formation" is meant both after the formation of the zinc oxide or ZnO layer and after the formation of the whole device. Ordinarily, the heat treatment is implemented after the formation of the whole device.

The First 41, and the Second Nonmagnetic Metal Layer 43

It is preferred that the first nonmagnetic metal layer 41 positioned below in FIG. 1 be made of Cu in particular, and the second nonmagnetic metal layer 43 positioned above be made of Zn in particular, as already noted. That is, the spacer layer 40 is made up of a triple-layer structure comprising Cu/ZnO/Zn from below in FIG. 1.

The first 41, and the second nonmagnetic metal layer 43 should have a thickness of the order of 0.3 to 2.0 nm.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. Usually, heat treatment is applied to the antiferromagnetic material of the aforesaid type (1), too, so as to put the direction of exchange coupling in order. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 4 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers or Ta and Ru layers is used. The underlay layer 21 has a thickness of about 2 to 6 nm as an example.

The area resistivity, AR, of the magnetoresistive device 8 (CPP-GMR device 8) here is in the range of 0.1 to 0.5$\Omega \cdot \mu m^2$, preferably 0.12 to 0.3$\Omega \cdot \mu m^2$, and more preferably 0.14 to 0.28$\Omega \cdot \mu m^2$.

The device (CPP-GMR device) to be measured for its area resistivity is a multilayer arrangement comprising underlay layer 21, antiferromagnetic layer 22, fixed magnetization layer 30, spacer layer 40, free layer 50 and protective layer 26, as shown in FIG. 1.

The insulating layer 4 shown in FIG. 1, for instance, may be made of alumina. The bias magnetic field-applying layer 6, for instance, may be made of a hard magnetic layer (hard magnet) or a multilayer structure of a ferromagnetic layer and an antiferromagnetic layer. Specifically, there is the mention of CoPt or CoCrPt.

It is here noted that the invention may be applied to any magnetoresistive device wherein the state of two magnetic layers functioning as sensors changes relatively in response to an external magnetic filed. In other words, the invention is in no sense limited to the type and structure of the device that has been explained so far in details. For instance, the inventive fabrication process for, and the structure of, the spacer layer 40 may be applied as well to a magnetoresistive device having as a basic structure a simple triple-layer structure of ferromagnetic layer/spader layer/ferromagnetic layer, as disclosed typically in U.S. Pat. No. 7,019,371 B2 or U.S. Pat. No. 7,035,062 B1.

[Explanation of Part of the Invention]

Part of the invention lies in how to form the zinc oxide or ZnO layer 42 that is a part of the construction of the spacer layer 40, as detailed below.

Before the zinc oxide or ZnO layer 42 that is part of the invention is finally formed, there are the following pre-steps. That is, prior to the step of forming the zinc oxide or ZnO layer 42, there are:

(1) the step of forming the first ferromagnetic layer for the formation of the first ferromagnetic layer 30, and (2) the step of forming on the aforesaid first ferromagnetic layer 30 the first nonmagnetic metal layer 41 that is a part of the construction of the spacer layer 40.

Following this, there is the step of forming on the first nonmagnetic metal layer 41 the zinc oxide or ZnO layer 42 that is part of the invention. The step of forming the zinc oxide layer 42 that is part of the invention is now explained in details.

Explanation of the Step of Forming the Zinc Oxide Layer 42

The process of forming the zinc oxide layer comprises the following two steps: (1) Zn film formation operation for the formation of a zinc or Zn film and (2) Zn film oxidization operation for oxidizing that zinc film after the formation of the zinc film.

The Zn film formation operation is implemented such that after a multilayer structure substrate having a multilayer structure before the formation of the Zn film is cooled down to a temperature range of −140° C. to −60° C., and preferably −120° C. to −80° C., the Zn film formation is set off.

Usually, a sputtering process using Zn as a target is used for the film formation of Zn. The "multilayer substrate having a multilayer structure before the formation of the Zn film" is understood to mean a multilayer substrate just before the formation of the Zn film. For instance, there is the mention of a substrate comprising on a slider substrate the first ferromagnetic layer 30 and the first nonmagnetic metal layer 41 that is a part of the construction of the spacer layer 40.

It is noted that when the ZnO film formation operation is repeated twice or more with the ZnO film divided into two or more layers, a part of the already formed ZnO film is often going to be included in the multilayer substrate, as described later.

As, at the time of setting off the formation of the Zn film, the multilayer substrate is down to less than −140° C. leading to an overcooled state, there is inconvenience that the crystal structure involved is out of order.

As, at the time of setting off the formation of the Zn film, the multilayer structure exceeds the temperature of −60° C. leading to an under-cooled state, it causes the Zn film itself to take on an islands form for the reason of a high Zn vapor pressure, giving rise to inconvenience or problems with crystallizability and film flatness.

Referring here to one typical example of the specific cooling method of cooling the "multilayer substrate having a multilayer structure before the formation of the Zn film" down to the given temperature range, the multilayer substrate is once transferred from a film-formation chamber into a cooling chamber where the substrate is placed on the cryogenic surface of a cryopump installed therein for cooling. The cryopump is a sort of reservoir type vacuum pump. The location of the cryogenic surface in the vacuum vessel makes the desired cooling operation feasible. In addition, the cryopump is of the oil-free type relying upon no oil (or of the dry type), producing clean vacuums, and its active range is as wide as 10 to $10^{-8}$ Pa.

The thus cooled multilayer substrate is again returned from the cooking chamber back to the film-formation chamber.

The "temperature of the multilayer substrate" here is supposed to be defined by the surface temperature of the multilayer substrate.

The thus formed Zn film is then oxidized by Zn film oxidization operation into a ZnO film. The Zn film oxidization operation is implemented such that oxidization treatment is set off in the temperature range of –120° C. to –40° C., and preferably –100° C. to –60° C.

The "substrate" here is the one having a Zn film before the oxidization treatment, and the "substrate temperature" is defined by the surface temperature of the substrate.

As, at the time of setting off the oxidization treatment of Zn, the multilayer substrate is down to less than –120° C. leading to an overcooled state, there is an out-of-order problem with the crystal structure involved. As, at the time of setting off the oxidization treatment of Zn, the multilayer structure exceeds the temperature of –40° C. leading to an under-cooled state, it offers a problem with crystallizability and film flatness for the reason of a high Zn vapor pressure.

Referring here to one typical example of the specific method of oxidizing the Zn film, the multilayer substrate with the Zn film formed on it is once passed from the film-formation chamber over to a chamber for oxidization treatment, where the Zn film on top of the multilayer structure is oxidized by radical oxidization, natural oxidization, oxidization during film formation or the like.

It is here noted that before the oxidization treatment of the Zn film, the substrate may be once again placed in the cooling chamber where it is again cooled down.

The Zn film is oxidized by the oxidization treatment into a ZnO film. After the completion of the oxidization treatment, the substrate is again returned from the chamber for oxidization back to the film-formation chamber.

The zinc oxide or ZnO layer should better be used in the temperature range of 1.0 to 2.5 nm, preferably 1.4 to 2.2 nm, and more preferably 1.6 to 2.0 nm, as mentioned above.

The above explanation goes for the case where the number of a series of one-set operation involving the Zn film formation operation and the Zn film oxidization operation is one.

To form a ZnO film having satisfactory flatness and crystallizability, it is desired that a series of one-set operation involving the Zn film formation operation and the Zn film oxidization operation be implemented at least twice in general, and twice or thrice in particular, at the Zn thickness of the thin film that is set such that the oxidization treatment can surely and easily occur.

Even when the ZnO film is formed by implementing the one-set operation twice or thrice, the aforesaid temperature conditions for the aforesaid Zn film formation and the Zn film oxidization treatment must be abided by. That is, the multilayer substrate having a multilayer structure before the formation of the Zn film should be set in the temperature range of –140° C. to –60° C., and the Zn film oxidization operation should be done in the temperature range of –120° C. to –40° C.

When a series of one-set operation is implemented twice or thrice, the Zn film can be thinned in one-set operation, rapid yet reliable oxidization operation is feasible, and a ZnO film excelling in flatness and crystallizability can be formed, as ascertained experimentally. The Zn film thickness in one-set operation should better be in the range of 0.3 to 2.0 nm, preferably 0.3 to 1.5 nm, and more preferably 0.5 to 1.0 nm.

The step of forming the second nonmagnetic metal layer 43 on the thus formed zinc oxide layer 42 is carried out, and the step of forming on the second nonmagnetic metal layer 43 the second ferromagnetic layer 30 functioning as the free layer is carried out.

[Explanation of the General Fabrication Process Before Reaching the Embodiment of the Magnetoresistive Device Shown in FIG. 1]

Reference is now made to the general fabrication process before reaching the embodiment of the magnetoresistive device shown in FIG. 1.

The general fabrication process of components near the magnetoresistive device of the reproducing head is now explained with reference to FIGS. 2A to 2D and FIGS. 3A to 3D.

FIGS. 2A to 2D are illustrative in section over time of the fabrication process of the magnetoresistive device of the reproducing head in particular, and FIGS. 3A to 3D are plan views of the fabrication process of the magnetoresistive device of the reproducing head. In FIGS. 2 and 3, the drawings having the same capital affixed to them (e.g., FIG. 2A and FIG. 3A) are a sectional view and a plan view at the same step.

Figure 2A:
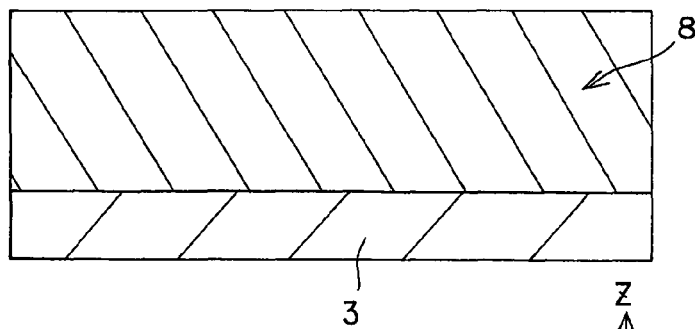
FIGS. 2A to 2D are illustrative over time of how to fabricate the magnetoresistive device of a reproducing head in particular.
Figure 3A:
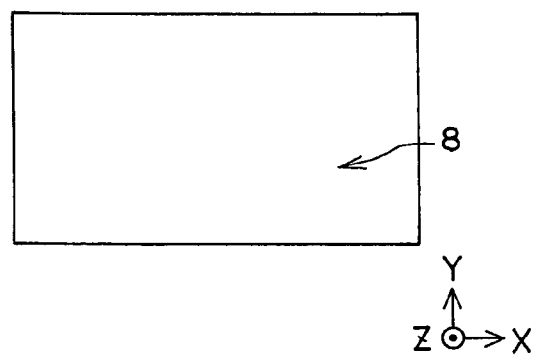
FIGS. 3A to 3D are plan views of how to fabricate the magnetoresistive device of a reproducing head.

(1) Explanation of the Steps Shown in FIGS. 2A and 3A

An underlay layer 21, an antiferromagnetic layer 22, a fixed magnetization layer 30 (first ferromagnetic layer 30), a spacer layer 40, a free layer 50 (second ferromagnetic layer), and a cap layer 26 (protective layer 26), each in a planar film shape, are stacked in order on a lower shield layer 3 (a lower shield that also serves as a lower electrode) into a multilayer planar film that becomes the basis of a magnetoresistive device 8.

Note here that the multilayer planar film that becomes the basis of the magnetoresistive device 8 is shown as a plain film 8 (hereinafter often called the MR film 8), rather than as a multilayered structure.

Referring here to FIG. 1, the spacer layer 40 is built up of the first and second nonmagnetic metal layers 41 and 43 with a zinc oxide or ZnO layer 42 interposed between them, as described above.

The step of forming the zinc oxide layer involves (1) the Zn film formation operation for forming the zinc or Zn film and (2) the Zn film oxidization operation for oxidizing that zinc film after the Zn film formation operation, as described above.

Figure 2B:
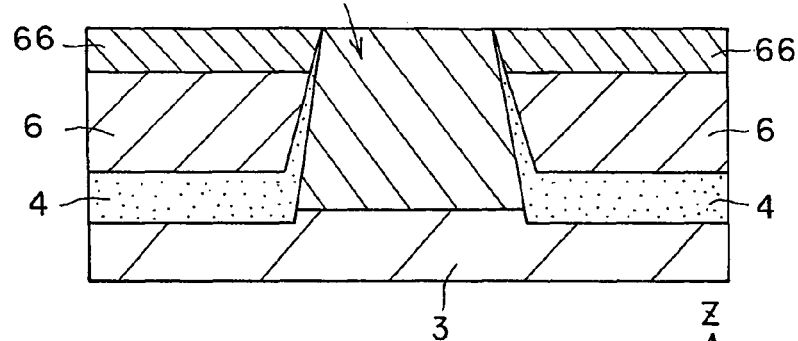
Figure 3B:
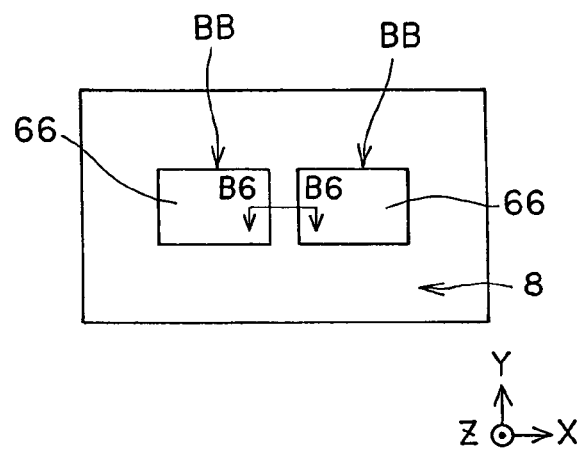

(2) Explanation of the Steps Shown in FIGS. 2B and 3B

FIG. 2B is a sectional view of FIG. 3B, as taken along an arrowed section B6-B6.

To form tracks for the MR film 8 shown in FIG. 3B, the MR film 8 is milled. That is, the MR 8 is masked over by a photoresist such that only two rectangular frames BB in FIG. 3B are exposed to view. The rectangular frames BB are removed off by milling and dug down to the lower shield layer 3 to form dents. Thereafter, the insulating layer 4 and the bias magnetic-applying layer 6 are filled in order in the dents formed by milling and digging. Then, the photoresist mask is lifted off, leading to the states shown FIGS. 2B and 3B.

Figure 2C:
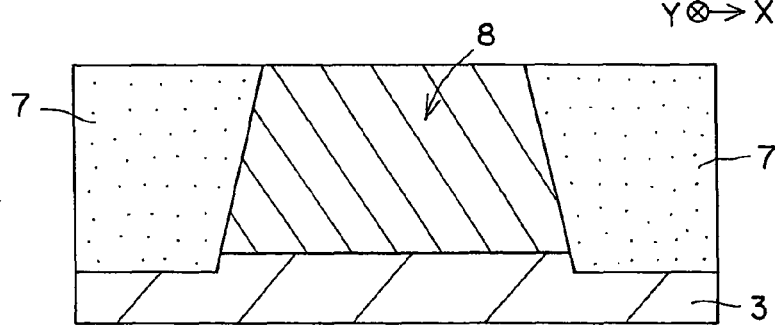
Figure 3C:
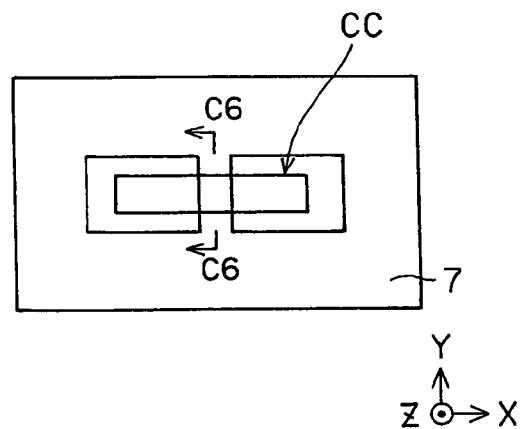

(3) Explanation of the Steps Shown in FIGS. 2C and 3C

FIG. 2C is a sectional view of FIG. 3C, as taken along an arrowed section C6-C6.

To form the so-called MR height that is the depth length of the MR film 8 shown in FIG. 3C, a rectangular frame CC of FIG. 3C is masked over by a photoresist. An unmasked region was milled off and dug down to the lower shield layer 3.

Thereafter, the insulating layer 7 is formed at the site created by milling, and the mask is lifted off, leading to the states shown in FIGS. 2C and 3C. The device portion lies on the lower shield layer 3, and the rest has an insulating layer formed on the substrate. It follows that the insulating layer 7 plays a role of isolating off the device electrically. The insulating layer 7 is integrally contiguous with the insulating layer 4.

Figure 2D:
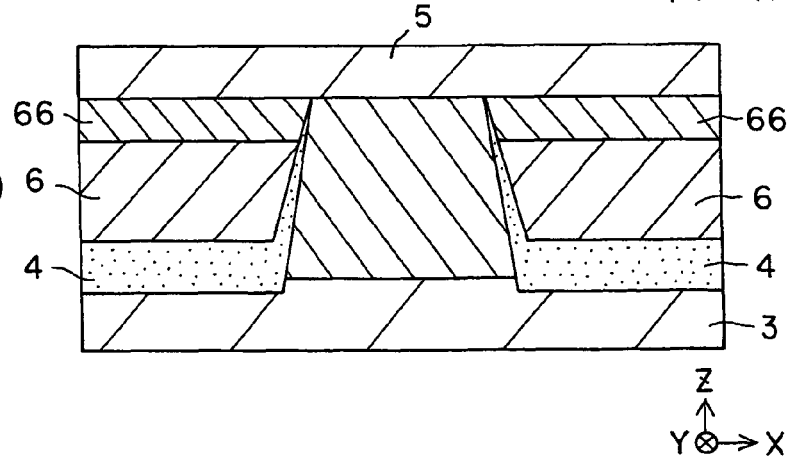
Figure 3D:
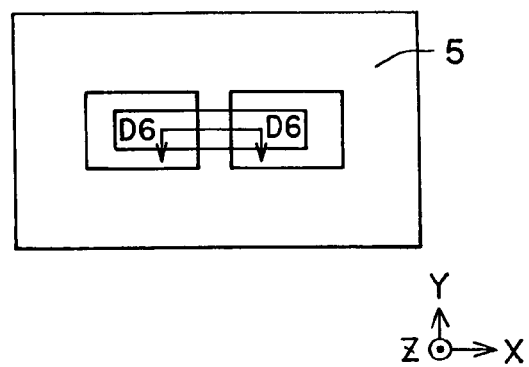

(4) Explanation of the Steps Shown in FIGS. 2D and 3D

FIG. 2D is a sectional view of FIG. 3D, as taken along an arrowed section D6-D6.

There is the upper shield layer 5 (a combined upper electrode and upper shield) formed, leading to the states shown in FIGS. 2D and 3D.

[Explanation of the Whole Construction of the Thin-Film Magnetic Head]

The whole construction of the thin-film magnetic head comprising the magnetoresistive device is now explained.

FIG. 4 is illustrative in section (section in the Y-Z plane) of a thin-film magnetic head parallel with the so-called air bearing surface (ABS).

A thin-film magnetic head 100 shown in FIG. 4 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 4, a slider substrate 1 made of a ceramic material such as AlTiC ($Al_2O_3.TiC$), and a magnetic head unit 101 formed on the slider substrate 1.

The magnetic head unit 101 has a multilayer structure comprising a reproducing head portion 100A adapted to implement reproducing processing of magnetic information recorded by making use of the magnetoresistive (MR) effect and, for instance, a shield type recording head portion 100B adapted to implement a perpendicular recording type processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive device 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like.

The magnetoresistive device 8 is a multilayer film formed in such a way as to be almost parallel with the side 1a of the slider substrate 1, forming a part of the medium opposite plane 70.

The magnetoresistive device 8 is a multilayer film of the current-perpendicular-to-plane type (CPP type) with a sense current passing in the direction perpendicular to the stacking plane.

As also shown in FIG. 4, between the second shield layer 5 and the recording head portion 100B there is an inter-device shield layer 9 formed that is made of a similar material as the second shield layer 5 is.

The inter-device shield layer 9 keeps the magnetoresistive device 8 functioning as a sensor out of a magnetic field occurring from the recording head portion 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive device 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive device 8 that faces away from the medium opposite plane 70, at the rear of the first and second shield layers 3, 5 and the inter-shield shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 4. It goes without saying that the recording head portion may be changed from the perpendicular recording mode to the so-called longitudinal recording mode.

The main magnetic pole layer 15 is set up as a magnetic guide path for guiding a magnetic flux induced by the coil layer 23 to the recording layer of the magnetic recording medium 10 with information being to be written on it while converging that magnetic flux. At the end of the main magnetic pole layer 15 here that is on the medium opposite plane 70 side, the width in the track width direction (along the X-axis of FIG. 4) and the thickness in the stacking direction (along the Z-axis of FIG. 4) of the main magnetic pole layer 15 should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 4, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 μm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 μm, and formed using, for instance, sputtering, CVD or the like.

[Explanation of the Head Gimbal Assembly and the Hard Disk System]

One each example of the head gimbal assembly and the hard disk system, used with the foregoing thin-film head mounted on it, is now explained.

A slider 210 included in the head gimbal assembly is first explained with reference to FIG. 5. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is a medium opposite plane 70 formed.

As the hard disk rotates in the z-direction in FIG. 5, it causes an air flow passing between the hard disk and the slider 210 to induce lift relative to the slider 210 in the downward y-direction in FIG. 5. This lift in turn causes the slider 210 to levitate over the surface of the hard disk. Note here that the x direction in FIG. 5 traverses tracks on the hard disk.

Near the end of the slider 210 on an air exit side (the left lower end in FIG. 5), there is a thin-film magnetic head formed according to the embodiment here.

A head gimbal assembly 220 according to this embodiment is now explained with reference to FIG. 6. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 6 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here is now explained with reference to FIGS. 7 and 8.

FIG. 7 is illustrative of part of the hard disk system, and FIG. 8 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiments.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

EXAMPLES

The invention of the aforesaid CPP-GMR device is now explained in further details with reference to some specific examples give below.

Experimental Example I

The inventive CPP-GMR device sample comprising such multilayer structure as set out in Table 1, given below, was prepared and readied up for experimentation.

TABLE 1

| Multilayer Structure | | Layer Material | Thickness (nm) |
|---|---|---|---|
| Protective layer (26) | | Ru | 2.0 |
| | | Ta | 2.5 |
| | | Ru | 1.0 |
| Free Layer (30) | | $Co_{70}Fe_{30}$ | 5.0 |
| | | Ru | 3.0 |
| | | $Co_{70}Fe_{30}$ | 4.0 |
| Spacer Layer (40) | $2^{nd}$ Nonmagnetic Metal Layer (43) | Zn | 0.4 |
| | Zinc Oxide Layer (42) | ZnO | 1.8 |
| | $1^{st}$ Nonmagnetic | Cu | 0.8 |

TABLE 1-continued

| Multilayer Structure | | Layer Material | Thickness (nm) |
|---|---|---|---|
| Fixed Magnetization Layer (50) | Metal Layer (41) | | |
| | Inner Layer (33) | $Co_{70}Fe_{30}$ | 4.0 |
| | Nonmagnetic Intermediate Layer (32) | Ru | 0.8 |
| | Outer Layer (31) | $Co_{70}Fe_{30}$ | 6.0 |
| Antiferromagnetic Layer (22) | | IrMn | 5.0 |
| Underlay Layer (21) | | (Ta/Ru) | (1.0/2.0) |

In the preparation of the samples of Experimental Example 1, the zinc oxide or ZnO layer 42 that was the intermediate layer of the spacer layer 40 was formed by a single one-set operation involving the Zn film formation operation for the zinc or Zn film and the Zn film oxidization operation for oxidizing that zinc film after the completion of the Zn film formation.

That is, Cu that was the first nonmagnetic metal layer 41 was formed at a thickness of 0.8 nm, and then the multilayer substrate containing that Cu layer as the top layer was cooled down to the given temperature (T1). Then, a 1.7 nm thick zinc or Zn film was sputtered on the multilayer substrate at the temperature T1. Thereafter, the radical oxidization of the Zn film was set off while the substrate was at the given temperature (T2) to form a 1.8 nm thick ZnO film.

Note here that the sputtering conditions for forming the zinc or Zn film were an output of 50 W, an Ar flow rate of 50 sccm, and a pressure of 2 Pa.

Also note that the radical oxidization of the Zn film were implemented at an output of 50 W and an accelerated power source of 250 W, using an Ar and $O_2$ gas admixture.

The multilayer substrate temperature (T1) at the time of setting off the aforesaid zinc or Zn film formation and the substrate temperature (T2) at the time of setting off the oxidization treatment were variously varied to prepare various such samples as set out in Table 2 given below.

Note here that the case where the substrate temperature (T2) at the time of setting off the radical oxidization treatment is lower than that the multilayer substrate temperature (T1) at the time of setting off the Zn film formation results from the fact that prior to the oxidization treatment, the substrate was again cooled down to the given temperature.

Each device sample was measured for (1) the surface roughness Ra (μm) of the surface of the ZnO film forming a part of the spacer layer, (2) the area resistivity AR ($\Omega \cdot \mu m^2$) of the device and (3) the MR ratio in the following ways. Note here that each CPP-GMR device sample was prepared by processing the multilayer film forming the basics of the device in a columnar form and protecting its sides with an insulator.

(1) Surface Roughness Ra (μm) of the Surface of the ZnO Film

The surface roughness was measured pursuant to JIS B0601-1009 that is the Japanese standard for surface roughness measurement.

In the invention, the target value for Ra is 0.1 to 0.3 nm.

(2) Area Resistivity AR ($\Omega \cdot \mu m^2$) of the Device

The dc four-terminal method was used.

In the invention, the target value for AR is 0.1 to 0.3 $\Omega \cdot \mu m^2$.

(3) MR Ratio

The MR ratio was measured by an ordinary dc four-terminal method. The MR ratio is a value obtained by dividing the amount of change of resistance ΔR by the resistance value R, and expressed in terms of ΔR/R. The MR ratio here is calculated as % because of being a very small figure.

Note here that the MR ratio is an average of 100 device samples.

In the invention, the target value for the MR ratio is at least 20%.

The aforesaid results of estimation are set out in Table 2 given below.

TABLE 2

| | Formation of the ZnO Layer | | | |
|---|---|---|---|---|
| Sample No. | Substrate temperature at the time of setting off the Zn film formation T1 (° C.) | Substrate temperature at the time of setting off the radical oxidization T2 (° C.) | Surface Roughness Ra (nm) | Area Resistivity of the device AR ($\Omega \cdot \mu m^2$) | MR ratio (%) |
| I-1 (Comp.) | −150 | −130 | 0.5 | 0.28 | 18.22 |
| I-2 | −140 | −120 | 0.1 | 0.21 | 21.62 |
| I-3 | −130 | −110 | 0.1 | 0.25 | 21.89 |
| I-4 | −120 | −100 | 0.1 | 0.23 | 21.77 |
| I-5 | −110 | −90 | 0.2 | 0.22 | 21.64 |
| I-6 | −100 | −80 | 0.2 | 0.26 | 21.58 |
| I-7 | −90 | −70 | 0.1 | 0.24 | 21.68 |
| I-8 | −80 | −60 | 0.2 | 0.20 | 21.68 |
| I-9 | −70 | −50 | 0.2 | 0.22 | 21.87 |
| I-10 | −60 | −40 | 0.2 | 0.23 | 21.57 |
| I-11 (Comp.) | −50 | −30 | 0.9 | 0.27 | 18.12 |
| I-12 | −60 | −120 | 0.1 | 0.24 | 21.49 |
| I-13 | −140 | −40 | 0.2 | 0.23 | 21.61 |
| I-14 (Comp.) | −100 | −130 | 0.5 | 0.27 | 18.77 |
| I-15 (Comp.) | −100 | −30 | 0.7 | 0.28 | 18.54 |
| I-16 (Comp.) | −150 | −100 | 0.5 | 0.26 | 19.02 |
| I-17 (Comp.) | −50 | −100 | 0.8 | 0.28 | 18.81 |
| I-18 (Comp.) | 20 (Room Tem.) | 20 (Room Tem.) | 2.0 | 0.48 | 15.55 |
| I-19 (Comp.) | Sputtering using ZnO as the target | | 1.0 | 0.53 | 15.98 |

From the results of Table 2, the advantages of the invention would be undisputed. That is, it has found that for the formation of the ZnO film, the method of obtaining the ZnO film by first forming the Zn film and then oxidizing the Zn film is preferable, and that the substrate temperature (T1) at the time of setting off the Zn film formation and the substrate temperature (T2) at the time of setting off the oxidization treatment must be kept within the ranges defined here, respectively.

Experimental Example II

The inventive CPP-GMR device sample comprising such multilayer structure as set out in Table 3, given below, was prepared and readied up for experimentation. The zinc oxide layer 42 was formed in two operations.

TABLE 3

| Multilayer Structure | Layer Material | Thickness (nm) |
|---|---|---|
| Protective Layer (26) | Ru | 2.0 |
| | Ta | 2.5 |
| | Ru | 1.0 |

TABLE 3-continued

| Multilayer Structure | | Layer Material | Thickness (nm) |
|---|---|---|---|
| Free Layer (30) | | $Co_{70}Fe_{30}$ | 5.0 |
| | | Ru | 3.0 |
| | | $Co_{70}Fe_{30}$ | 4.0 |
| Spacer Layer (40) | $2^{nd}$ Nonmagnetic Metal Layer (43) | Zn | 0.4 |
| | Zinc Oxide Layer (42) (two stackings) | ZnO ($2^{nd}$ Layer) | 0.9 |
| | | ZnO ($1^{st}$ Layer) | 0.9 |
| | $1^{st}$ Nonmagnetic Metal Layer (41) | Cu | 0.8 |
| Fixed Magnetization Layer (50) | Inner Layer (33) | $Co_{70}Fe_{30}$ | 4.0 |
| | Nonmagnetic Intermediate Layer (32) | Ru | 0.8 |
| | Outer Layer (31) | $Co_{70}Fe_{30}$ | 6.0 |
| Antiferromagnetic Layer (22) | | IrMn | 5.0 |
| Underlay Layer (21) | | (Ta/Ru) | (1.0/2.0) |

As described above, in the sample preparation of Experimental Example II, the zinc oxide layer 42 was formed in two operations. That is, the one-set treatment involving the Zn film formation and the oxidization treatment of that Zn film was implemented twice. The otherwise basic preparation method was carried out pursuant to Experimental Example I.

Preparation of Sample II-1 in Experimental Example II

In Experimental Example II, sample II-1 in general and the ZnO film in particular was prepared in the following way.

When the first ZnO film of 0.9 nm in thickness was formed, the multilayer substrate temperature (T1) at the time of setting off the Zn film formation was set at −130° C., and the substrate temperature (T2) at the time of setting off the oxidization treatment of that Zn film was set at −110° C. On the other hand, when the second ZnO film of 0.9 nm in thickness was formed, the multilayer substrate temperature (T1') at the time of setting off the second Zn film formation was set at −90%, and the substrate temperature (T2') at the time of setting off the oxidization treatment of that Zn film was set at −70° C.

Preparation of Sample II-2 in Experimental Example II

In Experimental Example II, sample II-2 in general and the ZnO film in particular was prepared in the following way.

When the first ZnO film of 0.9 nm in thickness was formed, the multilayer substrate temperature (T1) at the time of setting off the Zn film formation was set at −110° C., and the substrate temperature (T2) at the time of setting off the oxidization treatment of that Zn film was set at −90° C. On the other hand, when the second ZnO film of 0.9 nm in thickness was formed, the multilayer substrate temperature (T1') at the time of setting off the second Zn film formation was set at −70° C., and the substrate temperature (T2') at the time of setting off the oxidization treatment of that Zn film was set at −50° C.

Preparation of Sample II-3 in Experimental Example II

In Experimental Example II, sample II-3 in general and the ZnO film in particular was prepared in the following way.

When the first ZnO film of 0.9 nm in thickness was formed, the multilayer substrate temperature (T1) at the time of setting off the Zn film formation was set at −130° C., and the substrate temperature (T2) at the time of setting off the oxidization treatment of that Zn film was set at −110° C. On the other hand, when the second ZnO film of 0.9 nm in thickness was formed, the multilayer substrate temperature (T1') at the time of setting off the second Zn film formation was set at −130° C., and the substrate temperature (T2') at the time of setting off the oxidization treatment of that Zn film was set at −110° C. This sample II-3 could particularly be comparable to Sample I-3 in Experimental Example I.

Each of samples II-1, II-2 and II-3 was measured for similar physical properties as in Experimental Example I. The results are set out in Table 4 given just below.

TABLE 4

| Sample No. | Formation of the ZnO Layer | | | | Surface Roughness Ra(nm) | Area Resistivity of the Device AR (O · μm²) | MR ratio (%) |
|---|---|---|---|---|---|---|---|
| | T1 (° C.) | T2 (° C.) | T1' (° C.) | T2' (° C.) | | | |
| II-1 | −130 | −110 | −90 | −70 | 0.3 | 0.21 | 22.09 |
| II-2 | −110 | −90 | −70 | −50 | 0.3 | 0.22 | 22.53 |
| II-3 | −130 | −110 | −130 | −110 | 0.2 | 0.24 | 23.38 |
| I-3 | −130 | −110 | — | — | 0.1 | 0.25 | 21.89 |

Note here that Sample No. I-3 in Table 4 is the same as Sample No. I-3 in Table 2.

From the aforesaid results of experimentation, it has been found that even better properties are achievable by implementing the formation of the zinc oxide layer 42 in two operations.

Experimental Example III

The inventive CPP-GMR device sample comprising such multilayer structure as set out in Table 5, given below, was prepared and readied up for experimentation. The zinc oxide layer 42 was formed in three operations.

TABLE 5

| Multilayer Structure | | Layer Material | Thickness (nm) |
|---|---|---|---|
| Protective Layer (26) | | Ru | 2.0 |
| | | Ta | 2.5 |
| | | Ru | 1.0 |
| Free Layer (30) | | $Co_{70}Fe_{30}$ | 5.0 |
| | | Ru | 3.0 |
| | | $Co_{70}Fe_{30}$ | 4.0 |
| Spacer Layer (40) | $2^{nd}$ Nonmagnetic Metal Layer (43) | Zn | 0.4 |
| | Zinc Oxide Layer (42) (Three Stacks) | ZnO ($3^{rd}$ Layer) | 0.6 |
| | | ZnO ($2^{nd}$ Layer) | 0.6 |
| | | ZnO ($1^{st}$ Layer) | 0.6 |
| | $1^{st}$ Nonmagnetic Metal Layers (41) | Cu | 0.8 |
| Fixed Magnetization Layer (50) | Inner Layer (33) | $Co_{70}Fe_{30}$ | 4.0 |
| | Nonmagnetic Intermediate Layer (32) | Ru | 0.8 |
| | Outer Layer (31) | $Co_{70}Fe_{30}$ | 6.0 |
| Anti ferromagnetic Layer (22) | | IrMn | 5.0 |
| Underlay Layer (21) | | (Ta/Ru) | (1.0/2.0) |

As described above, in the sample preparation of Experimental Example III, the zinc oxide layer 42 was formed in three operations. That is, the one-set treatment involving the Zn film formation and the oxidization treatment of that Zn film was implemented thrice. The otherwise basic preparation method was carried out pursuant to Experimental Example I.

Preparation of Sample III-1 in Experimental Example III

In Experimental Example III, sample III-1 in general and the ZnO film in particular was prepared in the following way.

When the first ZnO film of 0.6 nm in thickness was formed, the multilayer substrate temperature (T1) at the time of setting off the Zn film formation was set at −130° C., and the substrate temperature (T2) at the time of setting off the oxidization treatment of that Zn film was set at −115° C. Then, when the second ZnO film of 0.6 nm in thickness was formed, the multilayer substrate temperature (T1') at the time of setting off the second Zn film formation was set at −100° C., and the substrate temperature (T2') at the time of setting off the oxidization treatment of that Zn film was set at −85° C. Then, when the third ZnO film of 0.6 nm in thickness was formed, the multilayer substrate temperature (T1") at the time of setting off the third Zn film formation was set at −70° C., and the substrate temperature (T2") at the time of setting off the oxidization treatment of that Zn film was set at −55° C.

Preparation of Sample III-2 in Experimental Example III

In Experimental Example III, sample III-2 in general and the ZnO film in particular was prepared in the following way.

When the first ZnO film of 0.6 nm in thickness was formed, the multilayer substrate temperature (T1) at the time of setting off the Zn film formation was set at −120° C., and the substrate temperature (T2) at the time of setting off the oxidization treatment of that Zn film was set at −110° C. Then, when the second ZnO film of 0.6 nm in thickness was formed, the multilayer substrate temperature (T1') at the time of setting off the second Zn film formation was set at −100° C., and the substrate temperature (T2') at the time of setting off the oxidization treatment of that Zn film was set at −90° C. Then, when the third ZnO film of 0.6 nm in thickness was formed, the multilayer substrate temperature (T1") at the time of setting off the third Zn film formation was set at −80° C., and the substrate temperature (T2") at the time of setting off the oxidization treatment of that Zn film was set at −70° C.

Preparation of Sample III-3 in Experimental Example III

In Experimental Example III, sample III-3 in general and the ZnO film in particular was prepared in the following way.

When the first ZnO film of 0.6 nm in thickness was formed, the multilayer substrate temperature (T1) at the time of setting off the Zn film formation was set at −130° C., and the substrate temperature (T2) at the time of setting off the oxidization treatment of that Zn film was set at −110° C. Then, when the second ZnO film of 0.6 nm in thickness was formed, the multilayer substrate temperature (T1') at the time of setting off the second Zn film formation was set at −130° C., and the substrate temperature (T2') at the time of setting off the oxidization treatment of that Zn film was set at −110° C. Then, when the third ZnO film of 0.6 nm in thickness was formed, the multilayer substrate temperature (T1") at the time of setting off the third Zn film formation was set at −130° C., and the substrate temperature (T2") at the time of setting off the oxidization treatment of that Zn film was set at −110° C.

This sample III-3 could particularly be comparable to Sample I-3 in Experimental Example I.

Each of samples III-1, III-2 and III-3 was measured for similar physical properties as in Experimental Example I. The results are set out in Table 6 given just below.

TABLE 6

| Sample No. | Formation of the ZnO Layer | | | | | | Surface Roughness Ra (nm) | Area Resistivity of the Device AR (Ω · μm$^2$) | MR ratio (%) |
| --- | --- | --- | --- | --- | --- | --- | --- | --- | --- |
| | T1 (° C.) | T2 (° C.) | T1' (° C.) | T2' (° C.) | T1" (° C.) | T2" (° C.) | | | |
| III-1 | −130 | −115 | −100 | −85 | −70 | −55 | 0.2 | 0.25 | 22.69 |
| III-2 | −120 | −110 | −100 | −90 | −80 | −70 | 0.2 | 0.24 | 23.32 |
| III-3 | −130 | −110 | −130 | −110 | −130 | −110 | 0.1 | 0.26 | 23.88 |
| I-3 | −130 | −110 | — | — | — | — | 0.1 | 0.25 | 21.89 |

Note here that Sample No. I-3 in Table 6 is the same as Sample No. I-3 in Table 2.

From the aforesaid results of experimentation, it has been found that even better properties are achievable by implementing the formation of the zinc oxide layer 42 in three operations.

From the aforesaid results of experimentation, the advantages of the invention would be undisputed.

That is, the invention provides a fabrication process for magnetoresistive devices (CPP-GMR devices) comprising a step of forming a zinc oxide or ZnO layer that provides an intermediate layer of a spacer layer, wherein said step comprises a Zn film formation operation for forming a zinc or Zn layer and a Zn film oxidization operation for oxidizing that zinc film after the Zn film formation operation, wherein the Zn film formation operation is such that after a multilayer substrate having a multilayer structure before the formation of the Zn film is cooled down to the temperature range of −140° C. to −60° C., film formation is set off, and the Zn film oxidization operation is such that after the completion of the formation of the Zn film, oxidization treatment is set off when a substrate temperature is in the temperature range of −120° C. to −40° C. Thus, the ZnO layer excels in both flatness and crystallizability so that the device can have a high MR ratio as well as an area resistivity best suited for device fabrication.

INDUSTRIAL APPLICABILITY

The present invention could be applied to the industry of magnetic disk systems comprising a magnetoresistive device operable to read the magnetic field intensity of magnetic recording media or the like as signals.

What is claimed is:

1. A fabrication process for a giant magnetoresistive device (CPP-GMR device) of CPP (current perpendicular to plane) structure, comprising a spacer layer comprising a first nonmagnetic metal layer and a second nonmagnetic metal layer, each one formed of a nonmagnetic metal material, with a zinc oxide or ZnO layer interposed between said first and second nonmagnetic metal layers, and a first ferromagnetic layer and a second ferromagnetic layer stacked and formed with said spacer layer sandwiched between them, with a sense current applied in the stacking direction, wherein said fabrication process comprises:

a first nonmagnetic metal layer formation step for forming said first ferromagnetic layer;

a step of forming said first nonmagnetic metal layer on said first ferromagnetic layer;

a step of forming said zinc oxide or ZnO layer on said first nonmagnetic metal layer;

a step of forming said second nonmagnetic metal layer on said zinc oxide layer; and a step of forming said second ferromagnetic layer on said second nonmagnetic metal layer; wherein:

the step of forming said zinc oxide layer comprises a Zn film formation operation for forming a zinc or Zn film and a Zn film oxidation operation for oxidizing said Zn film after the Zn film formation operation, wherein:

said Zn film formation operation is implemented such that a multilayer substrate having a multilayer structure before formation of the Zn film is cooled down, wherein the multilayer substrate temperature during said Zn film formation is −140 C to −60 C, and said Zn film oxidization operation is implemented such that the multilayer substrate temperature during said Zn film oxidation is −120 C to −40 C.

2. The fabrication process according to claim 1, wherein the oxidization treatment in the Zn film oxidization operation is a radical oxidization method.

3. The fabrication process according to claim 1, wherein said zinc oxide or ZnO layer has a thickness of 1.0 to 2.5 nm.

4. The fabrication process according to claim 1, wherein one-set operation comprising said Zn film formation operation and said Zn film oxidization operation is implemented at least twice.

5. The fabrication process according to claim 4, wherein Zn is formed at a thickness of 0.3 to 2.0 nm in one-set operation.

6. The fabrication process according to claim 1, wherein one-set operation comprising said Zn film formation operation and said Zn film oxidization operation is implemented at least thrice.

7. The fabrication process according to claim 6, wherein Zn is formed at a thickness of 0.3 to 1.5 nm in one-set operation.

8. The fabrication process according to claim 1, wherein said first and second ferromagnetic layers are set up such that an angle made between their mutual directions of magnetization changes relatively in response to an external magnetic field.

9. The fabrication process according to claim 1, wherein said first nonmagnetic metal layer is copper or Cu, and said second nonmagnetic metal layer is zinc or Zn.

10. A fabrication process for a thin-film magnetic head comprising a magnetoresistive device, characterized in that the magnetoresistive device is fabricated by a fabrication process as recited in any one of claims 1 to 9.

11. A fabrication process for a head gimbal assembly comprising a slider including a thin-film magnetic head and located in such a way as to oppose to a recording medium, and a suspension adapted to resiliently support said slider, characterized in that the thin-film magnetic head is fabricated by a fabrication process as recited in claim 10.

12. A fabrication process for a magnetic disk system comprising a slider including a thin-film magnetic head and located in such a way as to oppose to a recording medium, and a positioning device adapted to support and position said slider with respect to said recording medium, characterized in that the thin-film magnetic head is fabricated by a fabrication process as recited in claim 10.

* * * * *